US009508477B2

(12) United States Patent
Wu et al.

(10) Patent No.: US 9,508,477 B2
(45) Date of Patent: *Nov. 29, 2016

(54) SUPERCONDUCTING MAGNET SYSTEM

(71) Applicant: General Electric Company, Schenectady, NY (US)

(72) Inventors: Anbo Wu, Shanghai (CN); Minfeng Xu, Ballston Lake, NY (US); Timothy James Hollis, Bicester (GB); Ye Bai, Beijing (CN); Weijun Shen, Florence, SC (US); Evangelos Trifon Laskaris, Schenectady, NY (US); Jian-She Wang, Florence, NY (US); Yan Zhao, Shanghai (CN)

(73) Assignee: General Electric Company, Schenectady, NY (US)

( * ) Notice: Subject to any disclaimer, the term of this patent is extended or adjusted under 35 U.S.C. 154(b) by 99 days.

This patent is subject to a terminal disclaimer.

(21) Appl. No.: 14/531,140

(22) Filed: Nov. 3, 2014

(65) Prior Publication Data

US 2015/0072864 A1 Mar. 12, 2015

Related U.S. Application Data

(63) Continuation of application No. 13/559,256, filed on Jul. 26, 2012, now Pat. No. 8,914,086.

(30) Foreign Application Priority Data

Jul. 29, 2011 (CN) .......................... 2011 1 0216945

(51) Int. Cl.
*H01F 6/06* (2006.01)
*H01F 6/04* (2006.01)
(Continued)

(52) U.S. Cl.
CPC ............. *H01F 6/06* (2013.01); *G01R 33/3815* (2013.01); *G01R 33/288* (2013.01); *H01F 6/04* (2013.01)

(58) Field of Classification Search
CPC .............. H01F 6/06; H01F 6/02; H01F 6/04
See application file for complete search history.

(56) References Cited

U.S. PATENT DOCUMENTS

| 4,956,740 A | 9/1990 | Williams |
| 5,278,380 A | 1/1994 | Lowry |
| 5,329,266 A * | 7/1994 | Soeldner .............. G01R 33/421 324/319 |

(Continued)

FOREIGN PATENT DOCUMENTS

| CN | 1684330 A | 10/2005 |
| GB | 2247942 A | 3/1992 |

(Continued)

OTHER PUBLICATIONS

Office Action issued in connection with corresponding GB Application No. GB1213389.8 on May 12, 2015.

(Continued)

*Primary Examiner* — Colleen Dunn
(74) *Attorney, Agent, or Firm* — GE Global Patent Operation

(57) ABSTRACT

A superconducting magnet system includes a coil support structure, superconducting coils, and electrically and thermally conductive windings. The superconducting coils and the conductive windings are supported by the coil support structure. Each conductive winding is electromagnetically coupled with a corresponding superconducting coil. Each conductive winding is electrically shorted.

4 Claims, 8 Drawing Sheets

(51) Int. Cl.
G01R 33/3815 (2006.01)
*G01R 33/28* (2006.01)

(56) References Cited

U.S. PATENT DOCUMENTS

| | | |
|---|---|---|
| 5,668,515 A | 9/1997 | Ariyoshi |
| 6,147,844 A | 11/2000 | Huang et al. |
| 6,507,259 B2 | 1/2003 | Westphal et al. |
| 6,717,781 B2 | 4/2004 | Xu et al. |
| 7,116,535 B2 | 10/2006 | Huang |
| 7,161,777 B2 | 1/2007 | Tsuchiya et al. |
| 7,477,492 B2 | 1/2009 | Mallett |
| 7,605,587 B2 * | 10/2009 | Takeshima ............ A61B 5/055 324/307 |
| 8,305,173 B2 | 11/2012 | Tamura |
| 2005/0286180 A1 | 12/2005 | Huang et al. |
| 2011/0160064 A1 | 6/2011 | Pfleiderer et al. |

FOREIGN PATENT DOCUMENTS

| | | |
|---|---|---|
| GB | 2370360 A | 6/2002 |
| GB | 2440369 A | 1/2008 |
| JP | 6193604 A | 5/1986 |
| JP | 04134808 A | 5/1992 |
| JP | 06347575 A | 12/1994 |
| WO | 2008120007 A1 | 10/2008 |

OTHER PUBLICATIONS

Schultz, "Protection of Superconducting Magnets", IEEE Transactions on Applied Superconductivity, vol. No. 12, Issue No. 1, pp. 1390-1395, Mar. 2002.

Green et al., "The Inductive Coupling of the Magnets in MICE and its Effect on Quench Protection", IEEE Transactions on Applied Superconductivity, vol. No. 16, Issue No. 2, pp. 1304-1307, Jun. 2006.

Guo et al., "The Role of Quench-Back in the Passive Quench Protection of Long Solenoids With Coil Sub-Division", IEEE Transactions on Applied Superconductivity, vol. No. 20, Issue No. 3, pp. 2035-2038, Jun. 2010.

GB Search Report issued in connection with corresponding Application No. GB1213389.8 on Oct. 25, 2012.

GB Office Action issued in connection with corresponding Application No. GB1213389.8 on Nov. 18, 2014.

Yu et al., "Conceptual Design of a 3T MRI Superconducting Magnet With Non-Thrust Face Integrated Former," IEEE Transactions on Applied Superconductivity, vol. 20 , Issue: 3, Jun. 2010, pp. 773-776.

* cited by examiner

SUPERCONDUCTING MAGNET SYSTEM

CROSS-REFERENCE TO RELATED APPLICATIONS

This application is a continuation of the U.S. patent application Ser. No. 13/559,256, filed Jul. 26, 2012, which is hereby incorporated by reference in its entirety.

BACKGROUND

Superconducting magnet systems having relatively large energies are currently used in many applications. For example, superconducting magnet systems, storing energies of up to 10 M Joules, are constructed for Magnetic Resonance Imaging (MRI) systems which are now being routinely used in large numbers in clinical environments for medical imaging. A part of such an MRI system is a superconducting magnet system for generating a uniform magnetic field.

Superconducting magnets tend to be inherently unstable in that the temperature of a winding region of the magnet can rise relatively rapidly, due to a disturbance within the magnet itself or due to a cause external to the magnet. Such a temperature rise causes a quenching of that winding region, i.e., the superconducting winding goes from its superconducting state of essentially zero resistance to a resistive state. When such region gets hot very rapidly the stored energy within the magnet tends to become dissipated rapidly into that finite resistive region and may severely damage the magnet, even in some cases causing an actual melting of the superconducting wires in the winding.

Accordingly, it is necessary to provide protection for the winding, as well as for the winding of the persistent mode switch used in conjunction with the magnet, in order to ensure safe dissipation of the stored energy in case of such an instability. Furthermore, the magnetic field of the system may have to be discharged for reasons other than a malfunction of the magnet itself. For instance, it may be desirable to discharge the magnetic field if a ferromagnetic object is incidentally drawn into the strong field region.

Accordingly, protection and discharge of the magnet are often achieved by the use of heaters which are located both on the windings themselves and on the associated persistent mode switch (also called superconducting switch). If an instability occurs at one particular winding or winding region of the magnet, all of the heaters used thereon can be controlled into operation so as to quench all the other regions of the magnet, i.e., the stored energy dissipation does not occur only at the particular winding region where an initial quench has occurred but rather is dissipated throughout the entire magnet and thus the damage to any particular winding region can be prevented. However, quenching protection circuits using heaters sometimes are not very stable.

For these and other reasons, there is a need for embodiments of the invention.

BRIEF DESCRIPTION

A superconducting magnet system is provided. The superconducting magnet system includes a coil support structure, superconducting coils, and electrically and thermally conductive windings. The superconducting coils and the conductive windings are supported by the coil support structure. Each conductive winding is electromagnetically coupled with a corresponding superconducting coil. Each conductive winding is electrically shorted.

DRAWINGS

These and other features and aspects of embodiments of the present invention will become better understood when the following detailed description is read with reference to the accompanying drawings in which like characters represent like parts throughout the drawings, wherein.

DETAILED DESCRIPTION

Embodiments of the invention relate to a superconducting magnet system that includes a coil support structure, superconducting coils, and electrically and thermally conductive windings. The superconducting coils and the conductive windings are supported by the coil support structure. Each conductive winding is electromagnetically coupled with a corresponding superconducting coil. Each conductive winding is electrically shorted.

Unless defined otherwise, technical and scientific terms used herein have the same meaning as is commonly understood by one of ordinary skill in the art to which this invention belongs. The terms "first", "second", and the like, as used herein do not denote any order, quantity, or importance, but rather are used to distinguish one element from another. Also, the terms "a" and "an" do not denote a limitation of quantity, but rather denote the presence of at least one of the referenced items, and terms such as "front", "back", "bottom", and/or "top", unless otherwise noted, are merely used for convenience of description, and are not limited to any one position or spatial orientation. Moreover, the terms "coupled" and "connected" are not intended to distinguish between a direct or indirect coupling/connection between two components. Rather, such components may be directly or indirectly coupled/connected unless otherwise indicated.

Figure 1:
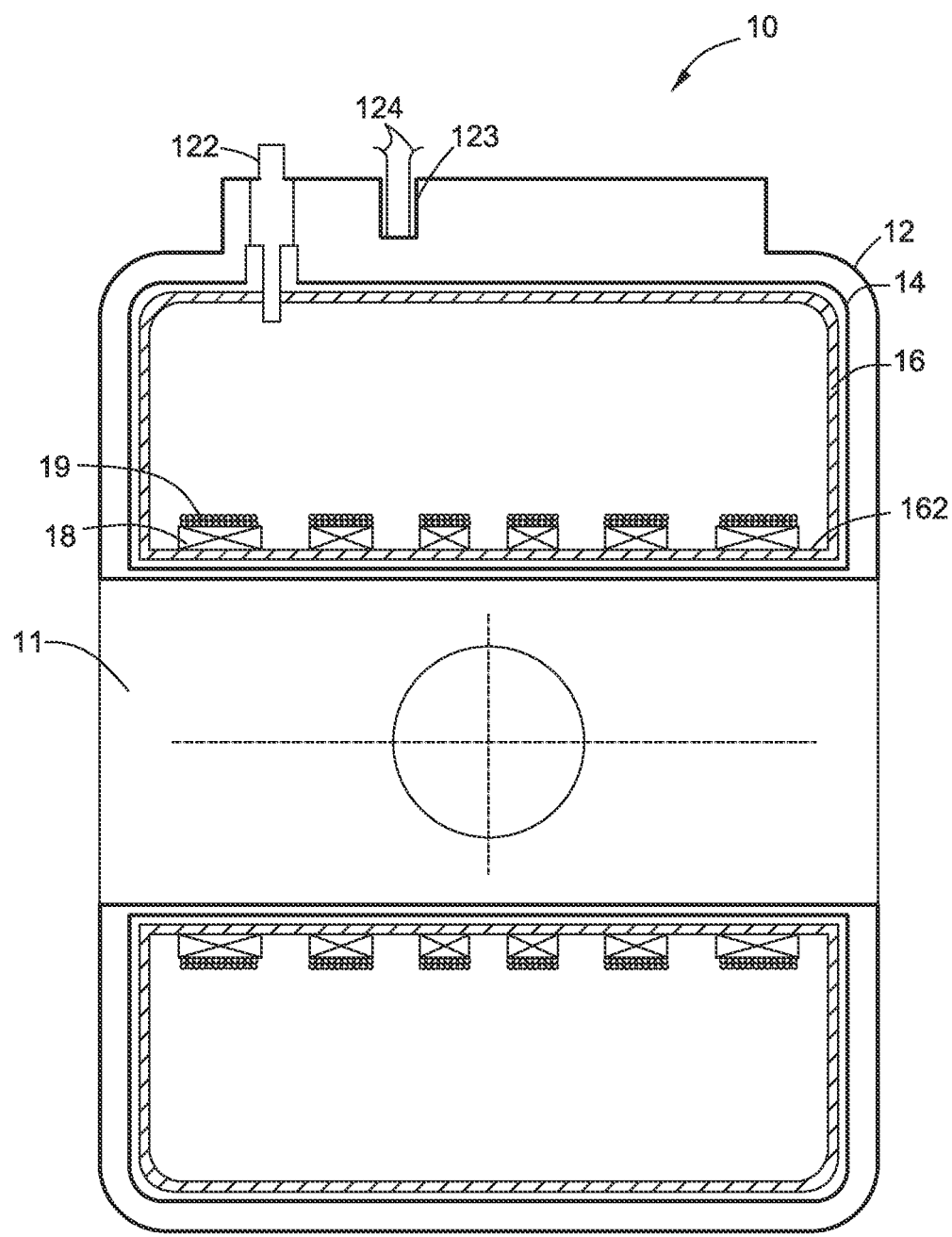
FIG. 1 is a schematic cross-sectional view taken along a vertical center line of a superconducting magnet system according to one embodiment.

Referring to FIG. 1, a superconducting magnet system 10 according to one embodiment includes a donut-shaped vacuum vessel 12 forming a central magnetic field area 11, a donut-shaped thermal shield 14 concentrically within the vacuum vessel 12, and a donut-shaped cryogen vessel 16 concentrically within the thermal shield 14. In the illustrated embodiment of FIG. 1, multiple superconducting coils 18 are wound on the bottom wall 162 of the cryogen vessel 16. Namely the bottom wall 162 acts as a coil support structure to support the superconducting coils 18. In other embodiments, the superconducting coils 18 can be wound or installed on other kinds of coil support structures such as metal formers and metal bars described in the latter paragraphs.

In the illustrated embodiment of FIG. 1, the vacuum vessel 12 may include a refrigerator 122 communicating with the thermal shield 14 and the cryogen vessel 16 to refrigerate the superconducting coils 18. For example, the cryogen vessel 16 is refrigerated down to about 4.2 kelvins (K). The space between the cryogen vessel 16 and the thermal shield 14 is refrigerated down to about 40-50K. The vacuum vessel 12 also includes a service port 123 providing communicating ports having multiple power leads 124 used to electrically couple external power to the superconducting coils 18 and other electrical parts. In other embodiments, the cryogen vessel 16 used for bath cooling of superconducting coils 18 can be removed, instead some thermosiphon cooling pipes (not shown) or other kinds of direction-conduction refrigerating means may be provided to refrigerate the superconducting coils 18 to operating cryogenic temperature.

The superconducting magnet system 10 may also include other elements, such as cooling tubes (not shown), a liquid storage (not shown), some additional circuits (not shown), and so on, which are conventional technology and, thus, not described and shown here for simplicity of illustration. In one embodiment, the superconducting magnet system 10 is a low temperature superconducting magnet system by winding or installing the superconducting coils with low temperature superconductors. In another embodiment, the superconducting magnet system 10 also can be a high temperature superconducting magnet system by winding or installing the superconducting coils with high temperature superconductors. The superconducting magnet system 10 can be used in many suitable fields, such as used in a magnetic resonance imaging (MRI) system and so on.

In the illustrated embodiment of FIG. 1, the superconducting magnet system 10 further includes multiple electrically and thermally conductive windings 19. Each conductive winding 19 is concentrically wound and physically in contact with a corresponding superconducting coil 18. In one embodiment, the materials of the electrically and thermally conductive windings 19 are copper, for example. In other embodiments, the materials of the conductive windings 19 can be any suitable electrically and thermally conductive material. In one embodiment, each conductive winding 19 is wound or installed as two layers on the corresponding superconducting coil 18 for ease of manufacturing. In other embodiments, each conductive winding 19 also can be wound or installed as one layer or more than two layers according to different requirements.

Figure 2:
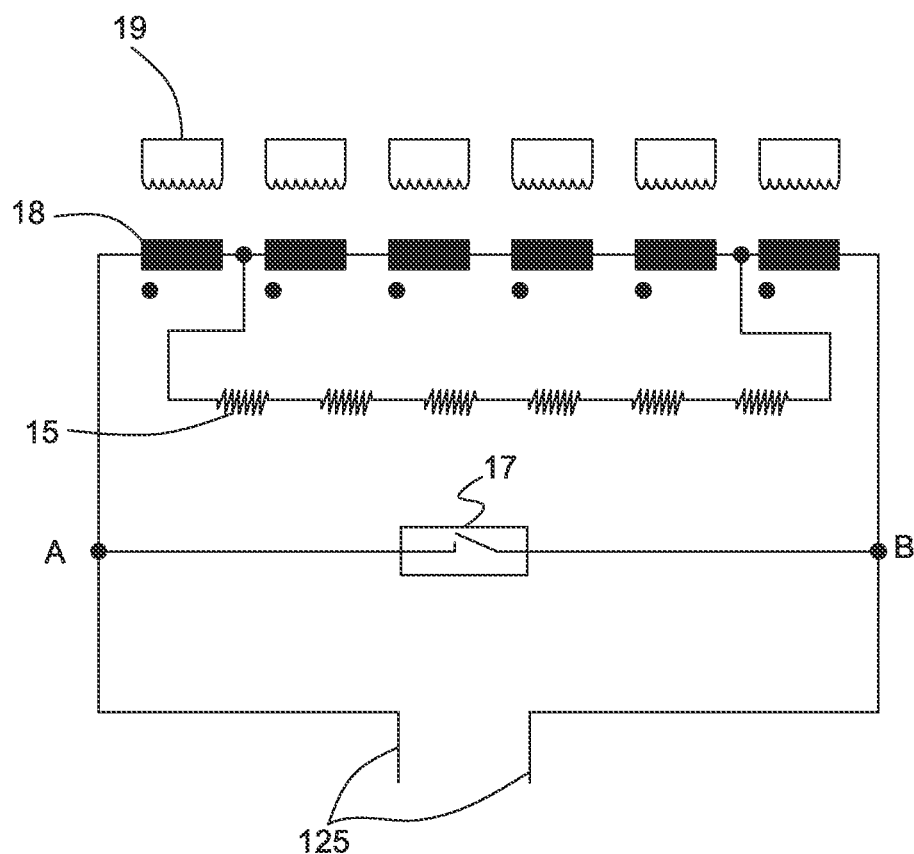
FIG. 2 is a circuit schematic diagram related to superconducting coils and electrically and thermally conductive windings of the superconducting magnet system of FIG. 1 according to a first embodiment.

Referring to FIG. 2, a circuit schematic diagram related to the superconducting coils 18 and the conductive windings 19 of the superconducting magnet system 10 is shown. The superconducting coils 18 are connected in series. Electrical current injection leads 125 (distributed from the power leads 124) are provided, and respectively coupled to two terminals A and B of the series connection of the superconducting coils 18. The terminals A and B of the superconducting coils 18 are respectively coupled to two terminals of a main superconducting switch 17. Multiple heaters 15 (not shown in FIG. 1) are provided and are respectively physically in contact with the superconducting coils 18 and are used to heat them when one or more of them quenches.

In the illustrated embodiment of FIG. 2, each conductive winding 19 is electrically shorted as a closed loop, for example, by clamping or soldering at the inlet and outlet leads thereof. When one or more of the superconducting coils 18 quenches, the magnetic field flux linked with the conductive windings 19 is changed correspondingly. On one hand, the heaters 15 are triggered to heat all of the superconducting coils 18 to prevent the quenched superconducting coil 18 from being damaged. However, sometimes the heater protecting circuit is not very stable and sufficient. So, on the other hand, because each conductive winding 19 is electromagnetically coupled with the corresponding superconducting coil 18, the magnetic field flux linked with the conductive windings 19 is changed, and the electrically conductive windings 19 induce eddy current therein, which can shunt current from the quenched superconducting coil 18 and share the load of joule heating at the quench initiation hot spot of the quenched superconducting coil 18. Meanwhile, because the thermally conductive windings 19 physically contact the superconducting coils 18 and joule heat is produced due to self-heating during an eddy current cycle in the conductive windings 19, the joule heat is conducted back to the superconducting coils 18, which can accelerate the quench propagation process in the superconducting coils 18. Accordingly, the conductive windings 19 can reduce the peak temperature and load stress inside the superconducting coils 18 during the quench process, and also can quench other superconducting coils 18 quickly by electromagnetic coupling and thermal conduction. Furthermore, the quench of the superconducting magnet system 10 is protected by physical configuration rather than circuit configuration, therefore this quenching protection is more stable. In other embodiments, if the electrically and thermally conductive windings 19 can implement adequate performance during the quench process, the heaters 15 can be deleted.

Figure 3:
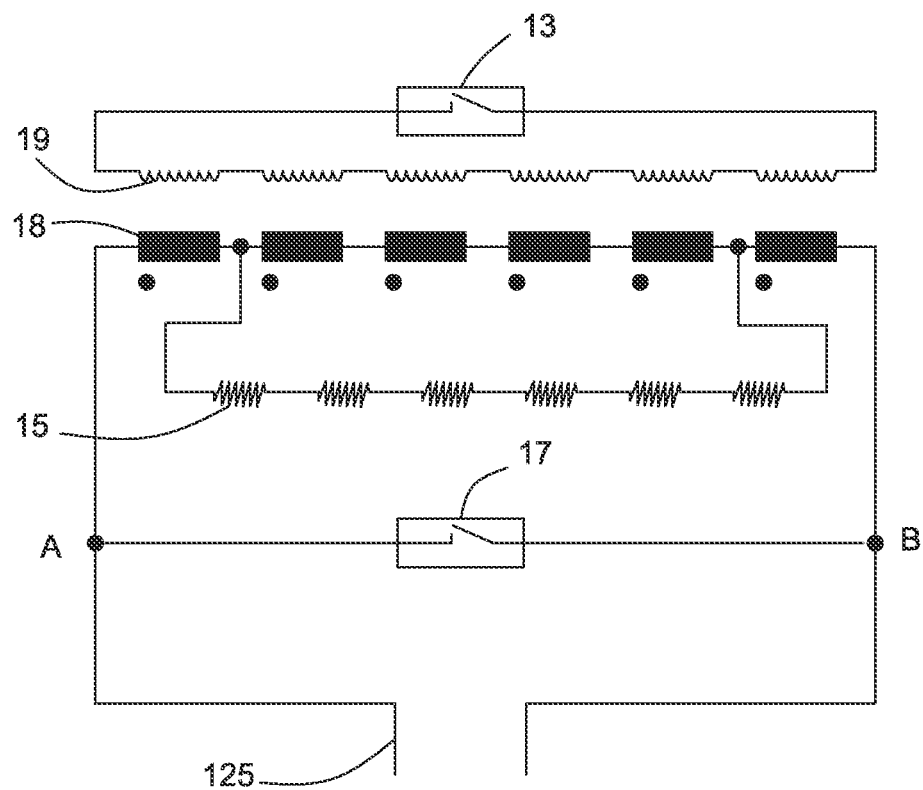
FIG. 3 is a circuit schematic diagram related to superconducting coils and electrically and thermally conductive windings of the superconducting magnet system of FIG. 1 according to a second embodiment.

In the illustrated embodiment of FIG. 3, the conductive windings 19 are electrically connected in series together with a secondary superconducting switch 13. The conductive windings 19 are wound with superconductor material having high copper to superconductor (Cu/Sc) ratio (such as greater than 3). The superconducting magnet system 10 may be used in an MRI system for example. On one hand, during normal operation, the secondary superconducting switch 13 is closed and may be controlled by a heater (not shown) similar to the control for the main superconducting switch 17. Thus, the conductive windings 19 with the secondary superconducting switch 13 form a moving metal compensation circuit or drift compensation circuit for the superconducting magnet system 10 of the MRI, which can supply a more uniform magnetic field for the MRI. When one or more of the superconducting coils 18 quenches, the conductive windings 19 can provide quench protection, which is described in the foregoing paragraphs.

Figure 4:
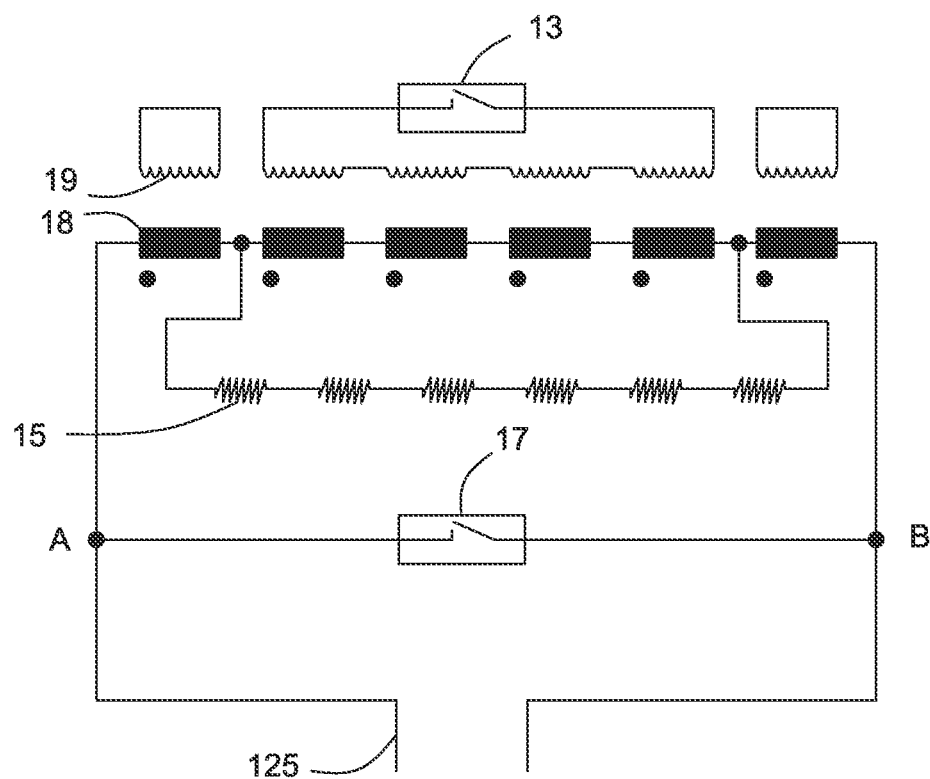
FIG. 4 is a circuit schematic diagram related to superconducting coils and electrically and thermally conductive windings of the superconducting magnet system of FIG. 1 according to a third embodiment.

In the illustrated embodiment of FIG. 4, four of the conductive windings 19 are electrically connected in series together with a secondary superconducting switch 13, and wound with the superconductor material with high Cu/Sc ratio. Each of the other two conductive windings 19 is electrically shorted as a closed loop and made of copper for example. Therefore, the four high Cu/Sc ratio superconducting material windings 19 have the same function as the conductive windings 19 depicted in FIG. 3, and the other two copper material conductive windings 19 have the same function as the conductive windings 19 depicted in FIG. 2. It should be noted that the embodiments of the connection configurations among the conductive windings 19 shown in FIGS. 2 to 4 are not representative of all possible embodiments and/or configurations; hence, a person having ordinary skill in the art would appreciate that the embodiments of the connection configuration among the conductive windings 19 can be changed or reconfigured according to different requirements.

Figure 5:
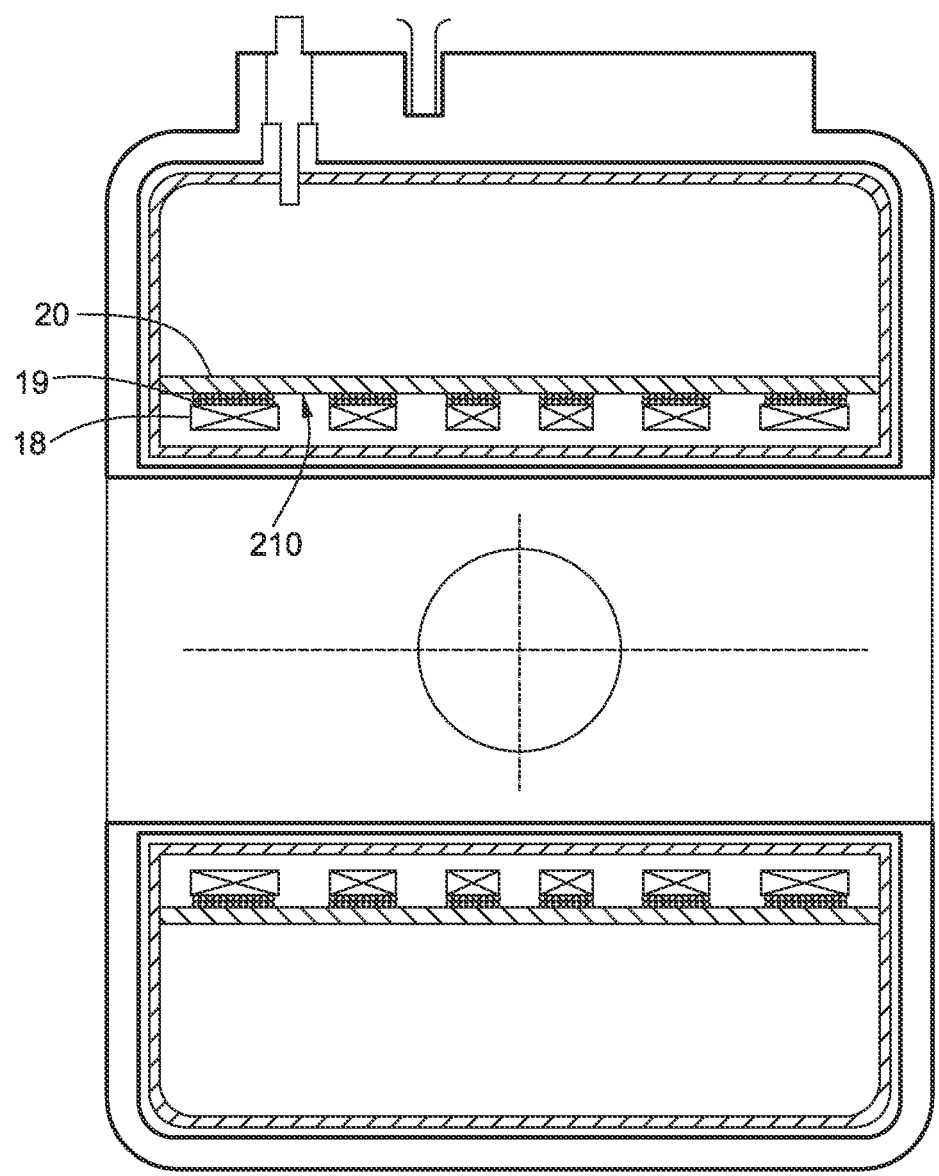
FIG. 5 is a schematic cross-sectional view taken along a vertical center line of a superconducting magnet system according to another embodiment.

In the illustrated embodiment of FIG. 5, a metal former (also named mandrel) 20 is provided compared with the illustrated embodiment of FIG. 1. The metal former 20 is cylinder-shaped and concentrically arranged in the cryogen vessel 16. Each superconducting coil 18 is installed on an inner surface of the corresponding conductive winding 19. Each conductive winding 19 with the corresponding superconducting coil 18 is installed on the inner surface 210 of the metal former 20, which forms the coil support structure instead of the bottom wall 162 of the cryogen vessel 16. The outer and inner surfaces of each conductive winding 19 respectively physically contact the inner surface 210 of the metal former 20 and the corresponding superconducting coil 18. On one hand, the metal former 20 supports the conductive windings 19 and the superconducting coils 18 as the coil support structure to make sure the construction is steady. On the other hand, because the metal former 20 physically contacts the thermally conductive windings 19, the metal former 20 can help the thermally conductive windings 19 to quickly conduct heat back to the superconducting coils 18 during a quench process, which can further accelerate the quench propagation process among the superconducting coils 18. Furthermore, the conductive windings 19 depicted in FIG. 5 have the same function of the conductive windings 19 mentioned for FIG. 1. In one embodiment, the material of the metal former 20 is aluminum.

Figure 6:
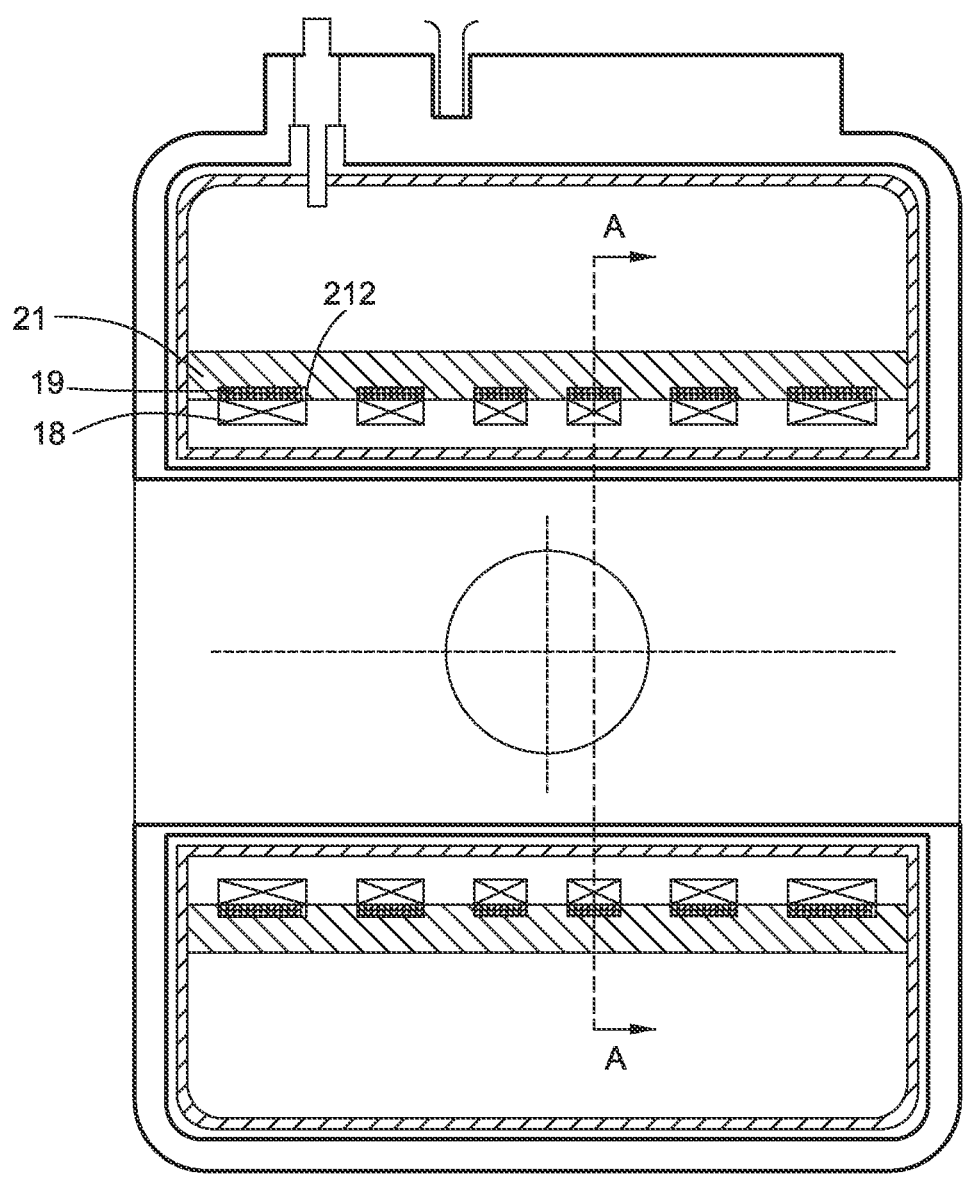
FIG. 6 is a schematic cross-sectional view taken along a vertical center line of a superconducting magnet system according to another embodiment.
Figure 7:
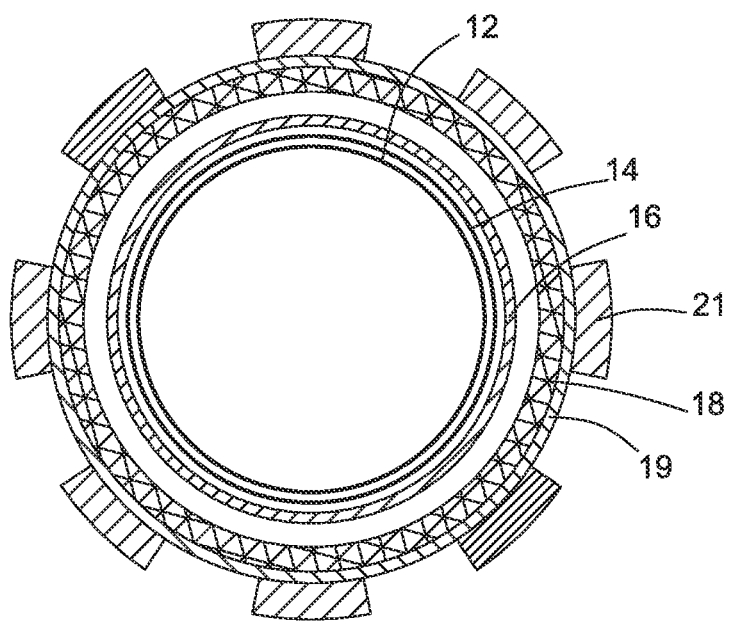
FIG. 7 is a schematic cross-sectional view taken along a line A-A of the superconducting magnet system of FIG. 6.

In the illustrated embodiment of FIGS. 6 and 7, multiple metal bars 21 are provided compared with the illustrated embodiment of FIG. 1. The metal bars 21 are arranged in the cryogen vessel 16 and axially parallel with the bottom wall 162 of the cryogen vessel 16. In one embodiment, the number of the metal bars 21 is eight to twelve and evenly arranged in cryogen vessel 16 along a circle. Each metal bar 21 defines multiple slots 212 corresponding to the conductive windings 19 and the superconducting coils 18. Each superconducting coil 18 is installed on an inner surface of a corresponding conductive winding 19. Each superconducting coil 18 with the corresponding conductive winding 19 is installed in the corresponding slots 212 of the metal bars 21, which forms the coil support structure instead of the bottom wall 162 of the cryogen vessel 16. The conductive windings 19 respectively physically contact the surface of the slots 212 and the superconducting coils 18. On one hand, the metal bars 21 support the conductive windings 19 and the superconducting coils 18 as the coil support structure to make sure the construction is steady. On the other hand, because the metal bars 21 physically contact the thermally conductive windings 19, the metal bars 21 can help the thermally conductive windings 19 to quickly conduct heat along an axial direction among the superconducting coils 18 during a quench process, which can further accelerate the quench propagation process between different superconducting coils 18. Furthermore, the conductive windings 19 depicted in FIGS. 6 and 7 have the same function of the conductive windings 19 mentioned for the embodiment of FIG. 1. In one embodiment, the metal bars 21 are made of aluminum. In other embodiments, the metal bars 21 can be made of any suitable metal material.

Figure 8:
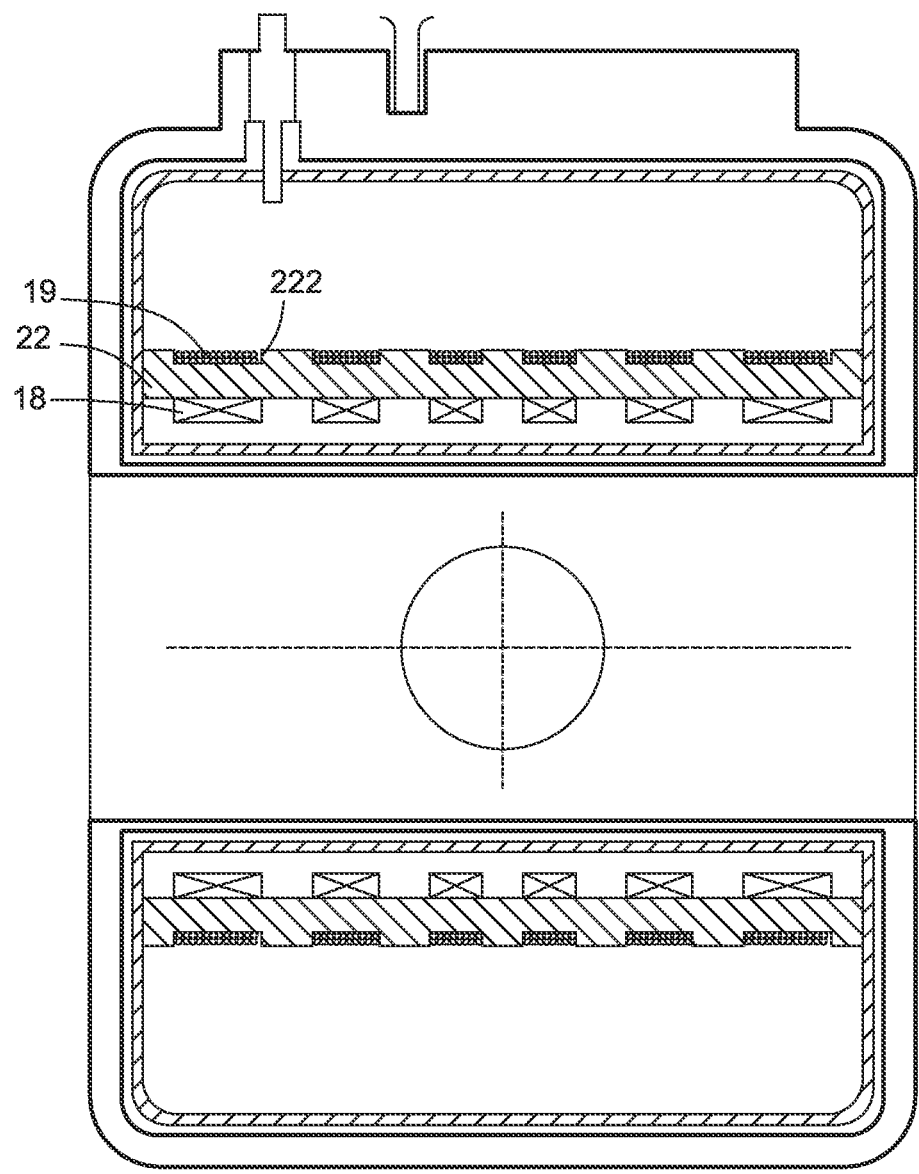
FIG. 8 is a schematic cross-sectional view taken along a vertical center line of a superconducting magnet system according to another embodiment.

In the illustrated embodiment of FIG. 8, a metal former 22 is provided compared with the illustrated embodiment of FIG. 1. The metal former 22 is cylinder-shaped and concentrically arranged in the cryogen vessel 16. The metal former 22 defines multiple parallel circle slots 222 in the outside surface thereof. The conductive windings 19 are respectively installed in the slots 222 of the metal former 22 and the superconducting windings 18 are installed on the inside surface of the metal former 22, which forms the coil support structure instead of the bottom wall 162 of the cryogen vessel 16. Each conductive winding 19 physically contacts the inner surface of the corresponding slot 222. On one hand, the metal former 22 supports the conductive windings 19 and the superconducting coils 18 as the coil support structure to make sure the construction is steady. On the other hand, because the metal former 20 physically contacts the thermally conductive windings 19, the metal former 20 can help the thermally conductive windings 19 to quickly conduct heat back to the superconducting coils 18 during a quench process, which can further accelerate the quench propagation process in the superconducting coils 18. Furthermore, the conductive windings 19 depicted in FIG. 8 have the same function of the conductive windings 19 mentioned for FIG. 1. In other embodiments, when the cryogen vessel 16 is omitted, some cooling pipes (not shown) may be provided and contacted to the metal former 20, the metal bar 21, or the metal former 22 to refrigerate the superconducting coils 18.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A superconducting magnet system comprising:
a thermal shield; and
a former as a coil support structure concentrically arranged in the thermal shield;
superconducting coils supported by the coil support structure;
electrically and thermally conductive windings supported by the coil support structure;
wherein each conductive winding is electromagnetically coupled with a corresponding superconducting coil, and each conductive winding is electrically shorted; and
wherein the conductive windings are installed on one of an inner surface of the former and an outer surface of the former.

2. The superconducting magnet system of claim 1, wherein the thermal shield is donut-shaped and the former is cylinder-shaped.

3. The superconducting magnet system of claim 1, wherein the former is made of metal material.

4. The superconducting magnet system of claim 3, wherein the metal material is aluminum.

* * * * *